US012739974B2

(12) United States Patent
Jeong et al.

(10) Patent No.: US 12,739,974 B2
(45) Date of Patent: Sep. 15, 2026

(54) POWER MODULE

(71) Applicants: Hyundai Motor Company, Seoul (KR); Kia Corporation, Seoul (KR)

(72) Inventors: Se Yoon Jeong, Hwaseong-si (KR); Jun Hee Park, Hwaseong-si (KR); Suk Hyun Lim, Hwaseong-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 214 days.

(21) Appl. No.: 18/610,019

(22) Filed: Mar. 19, 2024

(65) Prior Publication Data

US 2025/0081346 A1 Mar. 6, 2025

(30) Foreign Application Priority Data

Sep. 4, 2023 (KR) ........................ 10-2023-0117079

(51) Int. Cl.
*H05K 1/00* (2006.01)
*H05K 1/02* (2006.01)
*H05K 1/14* (2006.01)

(52) U.S. Cl.
CPC ........... *H05K 1/141* (2013.01); *H05K 1/0298* (2013.01); *H05K 2201/09063* (2013.01)

(58) Field of Classification Search
CPC ................. H05K 1/141; H05K 1/0298; H05K 2201/09063
See application file for complete search history.

(56) References Cited

U.S. PATENT DOCUMENTS

2016/0307818 A1* 10/2016 Kawase .............. H01L 23/3677
2019/0289709 A1* 9/2019 Liu ......................... H05K 1/118
2021/0225753 A1* 7/2021 Hong ................ H01L 23/49838
2022/0238413 A1* 7/2022 Grassmann ......... H01L 23/3735

FOREIGN PATENT DOCUMENTS

KR 10-1331724 11/2013
KR 10-2477304 12/2022
KR 10-2023-0000984 1/2023

* cited by examiner

*Primary Examiner* — Pete T Lee
(74) *Attorney, Agent, or Firm* — Fish & Richardson P.C.

(57) ABSTRACT

A power module includes a first substrate formed by stacking a plurality of layers in a first axis direction, a semiconductor chip electrically connected to the first substrate, a printed circuit board connected to the semiconductor chip and comprising at least one step portion with a reduced thickness compared to the surrounding area in the first axis direction, and at least one metal block mounted on the at least one step portion in the first axis direction and electrically connected to the first substrate.

17 Claims, 4 Drawing Sheets

POWER MODULE

CROSS REFERENCE TO RELATED APPLICATION

The present application claims priority to Korean Patent Application No. 10-2023-0117079, filed on Sep. 4, 2023, the entire contents of which are incorporated herein for all purposes by reference.

TECHNICAL FIELD

The present disclosure relates to a power module with improved manufacturing convenience and performance.

BACKGROUND

With the growing interest in the environment, there is a trend of increasing eco-friendly vehicles equipped with electric motors as power sources. Eco-friendly vehicles, also known as electrified vehicles, include electric vehicles (EVs) and hybrid electric vehicles (HEVs).

In electrified vehicles, an inverter may be equipped to convert direct current power to alternating current power for motor operation, and the inverter is usually composed of one or multiple power modules incorporating semiconductor chips that perform switching functions.

In some examples, such a power module is manufactured through a process of stacking and bonding a plurality of components, which involves various steps including guiding and fixing the position of each component and finally removing certain parts that may be unnecessary.

As the manufacturing process becomes more complex, it can lead to an increase in the time for producing the power module or introduce constraints on the design flexibility of the power module. There is therefore a need to simplify the manufacturing process of power modules.

The description of the background technology provided above is intended to enhance understanding of the background of the present disclosure and should not be construed as an acknowledgment that it is known prior art to those skilled in this technical field.

SUMMARY

It is an object of the present disclosure to provide a power module with a structure capable of simplifying the manufacturing process and improving performance by shaping a printed circuit board and mounting a metal block thereon.

The objects of the present disclosure are not limited to the aforesaid, and other objects not described herein will be clearly understood by those skilled in the art from the descriptions below.

According to one aspect of the subject matter described in this application, a power module includes a first substrate formed by stacking a plurality of layers in a first axis direction, a semiconductor chip electrically connected to the first substrate, a printed circuit board connected to the semiconductor chip and comprising at least one step portion with a reduced thickness compared to the surrounding area in the first axis direction, and at least one metal block mounted on the at least one step portion in the first axis direction and electrically connected to the first substrate.

For example, the at least one step portion may have a shape corresponding to the planar shape of the at least one metal block.

For example, the planar shape of the at least one step portion and the at least one metal block may form an engaging structure restricting positional changes of the at least one metal block in the second axis direction crossing the first axis direction.

For example, the metal block may have a planar shape with one side wider than the other side in the second axis direction, and the step portion may have a shape formed for the center part of the printed circuit board to correspond to one end of the metal block in the second axis direction and for the outer part of the printed circuit board to correspond to the other end of the metal block.

For example, the step portion may be formed on one side of the printed circuit board facing the first substrate, and the metal block is positioned between the first substrate and the printed circuit board.

For example, the first substrate may include at least one step portion with a reduced thickness compared to the surrounding area in the first axis direction.

For example, the step portion of the printed circuit board may have a shape corresponding the shape of one side of the metal block in the first axis direction, and the step portion of the first substrate may have a shape corresponding to the shape of the other side of the metal block in the first axis direction.

For example, the at least one metal block may be positioned to be spaced apart with respect to the semiconductor chip therebetween in the second axis direction crossing the first axis.

For example, in some implementations, a power module may further include a second substrate formed by stacking a plurality of layers in the first axis direction and spaced apart from the first substrate with the semiconductor chip in between, wherein the at least one metal block may be connected to at least one of the first and second substrates.

For example, the printed circuit board may include the at least one step portion on each of one side and the other side in the first axis direction.

For example, the at least one step portion formed on one side of the printed circuit board and the at least one step portion formed on the other side may overlap at least partially in the planar view.

For example, the printed circuit board may include a through hole allowing a spacer extending in the first axis direction to be inserted between the first and second substrates and connected to the semiconductor chip.

For example, the through hole may have an area corresponding to the cross-sectional area of the spacer in the first axis direction.

For example, the first substrate, semiconductor chip, and at least one metal block may be stacked in the first axis direction and sequentially joined.

For example, the metal block may protrude from the printed circuit board in the second axis direction crossing the first axis direction for connection to an external terminal.

As described above, the power module in various implementations of the present disclosure is advantageous in terms of improving the convenience of manufacturing power modules by using a structure allowing for mounting a metal block on a printed circuit board, which eliminates the processes of aligning and fixing the assembly position with guide jigs and removing certain parts that may be unnecessary after assembly.

In addition, the design flexibility improved by this structure makes it possible to secure additional thermal dissipation area within the power module or create current paths that reduce parasitic inductance, thereby improving the performance of the power module.

Furthermore, the structure allowing for spacers to be pressed into the printed circuit board makes it possible to broaden the range of material choices for forming current paths and enhance heat dissipation performance.

The advantages of the present disclosure are not limited to the aforesaid, and other advantages not described herein may be clearly understood by those skilled in the art from the descriptions below.

DETAILED DESCRIPTION

The specific structural or functional descriptions of the implementations of the disclosure disclosed in this specification or patent application are illustrative examples intended to describe implementations of the present disclosure, and the implementations of the present disclosure can be implemented in various forms and should not be construed as being limited to those described in this specification or the application.

In some implementations, a power module can improve the convenience of manufacturing a power module and enhance the performance of the power module simultaneously with the introduction of a printed circuit board with a structure capable of serving as a guide jig and a metal block capable of serving as power leads for electrical connections to the outside.

Hereinafter, a description is made of the power module according to one or more implementations of the present disclosure with reference to FIGS. 1 to 4.

Figure 1:
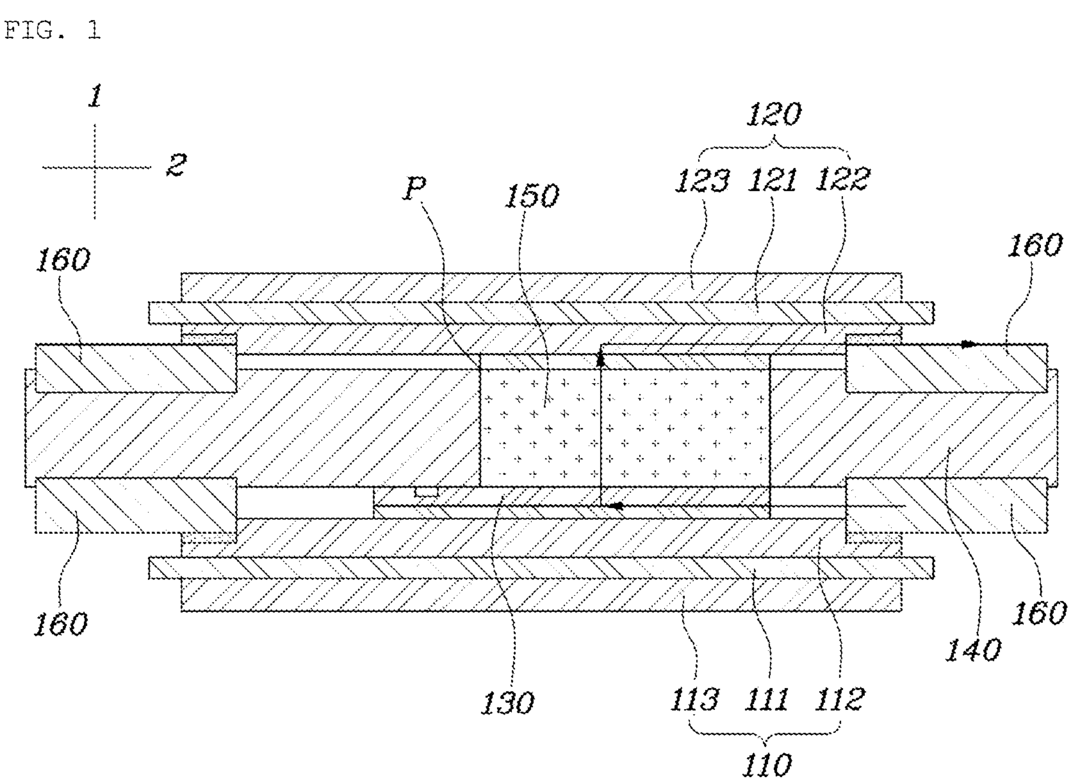
FIG. 1 is a diagram illustrating an example of a power module.
Figure 2:
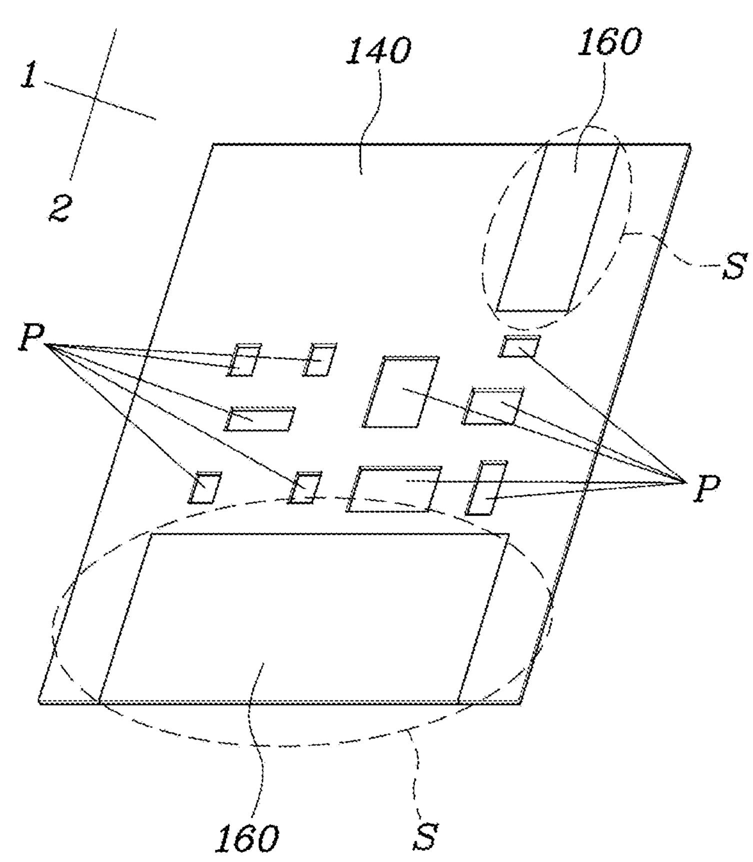
FIG. 2 is a diagram illustrating an example of a printed circuit board.
Figure 3:
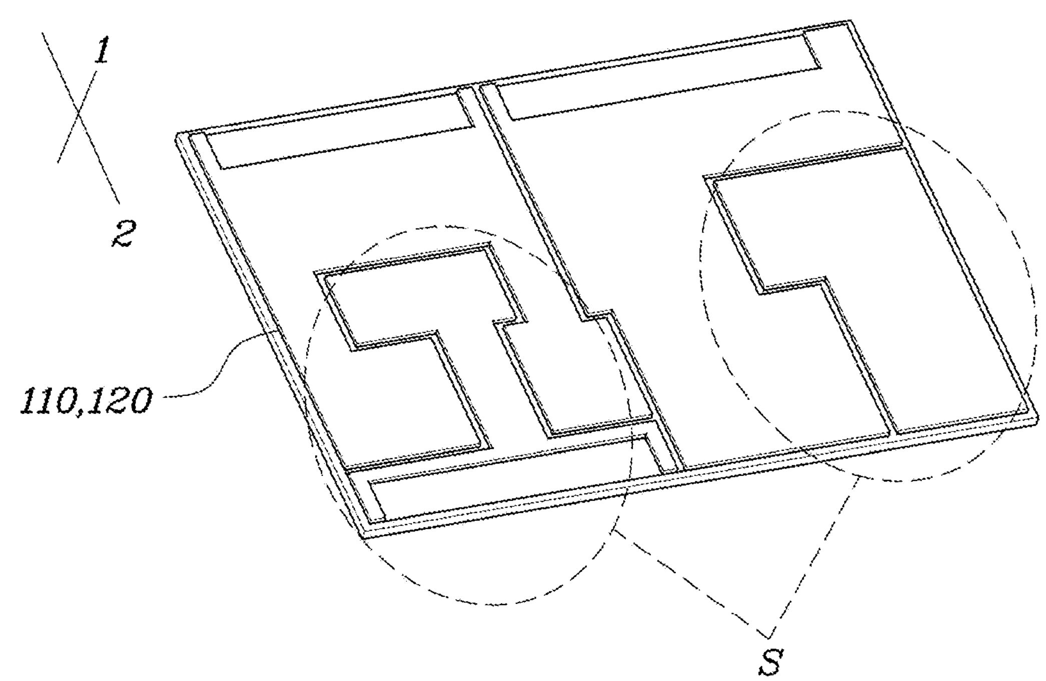
FIG. 3 is a diagram illustrating an example of a first substrate and a second substrate.
Figure 4:
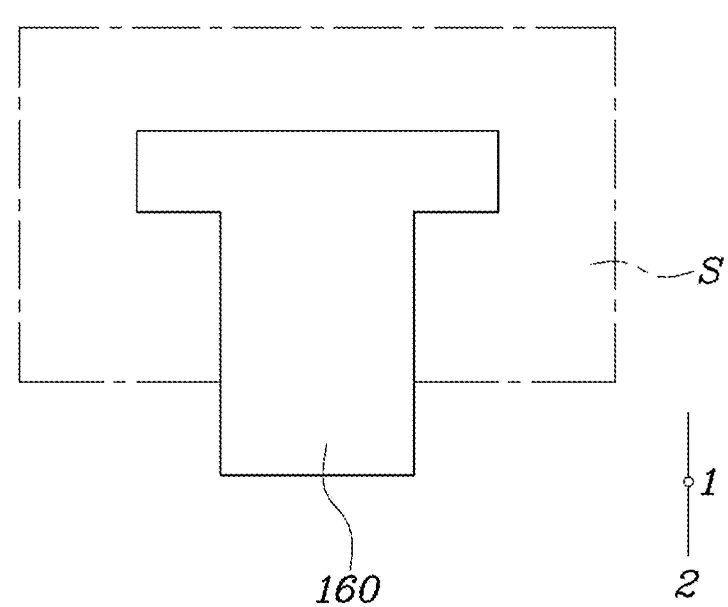
FIG. 4 is a diagram illustrating an example of a shape of a step portion.

FIG. 1 is a diagram illustrating a power module of the present disclosure, FIG. 2 is a diagram illustrating a printed circuit board of the present disclosure, FIG. 3 is a diagram illustrating a first substrate and a second substrate of the present disclosure, and FIG. 4 is a diagram illustrating the shape of a step portion of the present disclosure.

With reference to FIGS. 1 to 4, a power module of the present disclosure may include a first substrate 110, a second substrate 120, a semiconductor chip 130, a printed circuit board 140, a spacer 150, and a metal block 160. However, it should be noted that FIGS. 1 to 4 primarily show the components essential to the description of an implementation of the present disclosure, and the actual power module may be implemented with more or fewer components.

In some implementations, the first substrate 110 may be formed by stacking a plurality of layers 111, 112, and 113 in the first axis direction, and the second substrate 120 may be formed by stacking a plurality of layers, 121, 122, and in the first axial direction.

In some implementations, a power module may be implemented in a structure with only the first substrate 110 or in a structure with both the first and second substrates 110 and 120, and the implementation in a structure with only the first substrate 110 may be referred to as a single-sided cooling method, while the implementation in a structure with both the first and second substrates 110 and 120 may be referred to as a double-sided cooling method. Among these two methods, FIG. 1 shows an implementation of a power module with a double-sided cooling method.

The multiple layers 111, 112, 113, 121, 122, and 123 constituting the first and second substrates 110 and 120 may include insulating layers 111 and 121 and metal layers 112, 113, 122, and 123, and the metal layers 112 and 113 of the first substrate 110 and the metal layers 122 and 123 of the second substrate 120 may be respectively disposed on both sides of the insulating layers 111 and 121. Although the first substrate 110 and the second substrate 120 are distinguished for the convenience of explanation in the above and below descriptions, the first substrate 110 and the second substrate 120 are not limited in position or connection relationship, and particularly in the following descriptions, the description of the first substrate 110 is similarly applicable to the second substrate 120.

The semiconductor chip 130 is electrically connected to at least the first substrate 110, and in the case where the power module is equipped with both the first and second substrates 110 and 120 as shown in FIG. 1, the semiconductor chip 130 may be electrically connected to both the first and second substrates 110 and 120.

With reference to FIG. 2, the printed circuit board 140 is connected to the semiconductor chip 130 and may have at least one step portion S with a reduced thickness compared to the surrounding area in the first axis direction.

The metal block 160 may be provided at least one or more and may be mounted on each of at least one step portion S in the first axis direction. In addition, the metal block 160 protrudes from the printed circuit board 140 in the second axis direction crossing the first axis direction, allowing for connection to an external terminal to form a current path.

In this case, the at least one step portion S may have a shape corresponding to the planar shape of the at least one metal block 160. That is, the shape of each step portion S may be formed to correspond to the planar shape of the metal block 160 to be mounted thereon.

Through such shapes of the step portion S and metal block 160, the step portion S of the printed circuit board 140 may replace the role of guide jigs during the manufacturing process, allowing the metal block 160 to be positioned in the desired assembly location without the need for separate guide jigs.

In particular, the planar shape of the step portion S and metal block 160 may form an engaging structure restricting positional changes of the metal block 160 in the second axis direction (i.e., the left-right direction on the drawing) crossing the first axis direction. As a result, the metal block 160 may maintain the desired assembly position without deviating beyond the allowable range from the position guided through the step portion S during the manufacturing process.

In more detail, with reference to FIG. 4 illustrating the detailed shape of the step portion S, the metal block 160 may have a planar shape with one side wider than the other in the second axis direction, and the step portion S is formed in a way that the center part of the printed circuit board 140 corresponds to one end of the metal block 160 in the second axis direction while the outer part of the printed circuit board 140 corresponds to the other end of the metal block 160, forming the engaging structure described above.

In some examples, the at least one step portion S may be formed on one side of the printed circuit board 140 facing the first substrate 110, and the at least one metal block 160 may be positioned between the first substrate 110 and the printed circuit board 140. This structure makes it possible to connect the metal block 160 to the first substrate 110 to form a current path while limiting the positional changes of the metal block 160 in the first axis direction by the first substrate 110 and the printed circuit board 140.

In this case, the metal block 160 is effectively secured in the first axis direction by the first substrate 110 and the printed circuit board 140, and in the second axis direction by the step portion S of the printed circuit board 140, allowing it to maintain the desired assembly position during the manufacturing process.

With reference to FIG. 3, in addition to the printed circuit board 140, the first substrate 110 may also have a step portion S with a reduced thickness compared to the surrounding area in the first axial direction in the plane, and in this case, the first substrate 110 may also limit the positional changes of the metal block 160 in the second axis direction via the step portion S formed thereon.

In particular, when both the first substrate 110 and the printed circuit board 140 are provided with the step portion S, the step portion S on the printed circuit board 140 corresponds to the shape of one side in the first axis direction of the metal block 160, while the step portion S on the first substrate 110 may correspond to the shape of the other side of the metal block 160.

In some examples, the at least one metal block 160 may be positioned to be spaced apart with respect to the semiconductor chip 130 in the second axis direction crossing the first axis direction. For example, with reference to FIG. 1, the metal block 160 may be positioned spaced apart to the left and right of the semiconductor chip 130. The arrangement of metal block 160 is not limited to any specific configuration and may be changed in various ways, and particularly, may be determined to properly set the current path.

As shown in FIG. 1, in addition to the first substrate 110, which has been the main focus of the above description, the power module of the present disclosure may also include the second substrate 120, which is formed by stacking multiple layers in the first axis direction and is positioned apart from the first substrate 110 with the semiconductor chip 130 in between.

In this case, the at least one metal block 160 may be electrically connected to both the first and second substrates 110 and 120, and each of the metal block 160 may be connected to the first substrate 110 or the second substrate 120.

For example, as shown in FIG. 1, four metal blocks 160 may be respectively arranged at the upper left, lower left, upper right, and lower right of the printed circuit board 140, the metal blocks 160 arranged at the upper left and upper right being connected to the bottom surface of the second substrate 120, the metal blocks 160 arranged at the lower left and lower right being connected to the top surface of the first substrate 110.

In this case, the printed circuit board 140 may have step portions S formed in at least some parts of each of one side and the other side in the first axis direction, guiding and restricting the position changes of the upper and lower positioned metal blocks 160.

In particular, the step portions S formed on one side of the printed circuit board 140 and the step portions S formed on the other side may overlap at least partially in the planar view, allowing the metal blocks 160 placed on the respective sides of the printed circuit board 140 to also overlap in the planar view.

When the metal blocks 160 overlap in the planar view, i.e., when they are arranged apart vertically rather than horizontally, the current path may be shortened, which leads to an increased current superposition effect, resulting the improvement of electrical performance of the power module such as reduced parasitic inductance.

In addition, unlike what is shown in FIG. 1, the metal blocks 160 may be arranged at the top or bottom of either the left or right side of the printed circuit board 140 by two, or on both the top and bottom of the printed circuit board 140, allowing for the improvement of the design flexibility of the patterns on the first and second substrates 110 and 120 for forming a current path.

In some examples, with reference to FIGS. 1 to 4, the printed circuit board 140 may have a through hole P that allows a spacer 150 extending in the first axis direction to be inserted between the first substrate 110 and the second substrate 120 and connected to the semiconductor chip 130. The number and formation positions of the through holes P may be determined based on the arrangement of the spacer 150.

In addition, the through hole P may have an area corresponding to the cross-sectional area of the spacer 150 in the first axis direction. For example, the through hole P may have an area equal to or slightly less than the cross-sectional area of the spacer 150 such that the inserted spacer 150 can be pressed into the through hole P, thereby fixing the printed circuit board 140 and the spacer 150 to each other.

In some examples, the first substrate 110, semiconductor chip 130, and at least one metal block 160 may be stacked in the first axis direction and subsequently joined, or they may be joined after the second substrate 120 is added to the stack. That is, with the structure in which the metal block 160 is fixed in place on the first substrate 110, the second substrate 120, and the printed circuit board 140, each component can maintain its proper assembly position until the stacking is complete without being joined each time a component is stacked, allowing for the power module to be manufactured with only one joining process for the entire assembly after the final stacking.

As described above, the power module in various implementations of the present disclosure is advantageous in terms of improving the convenience of manufacturing power modules by using a structure allowing for mounting a metal block on a printed circuit board, which eliminates the processes of aligning and fixing the assembly position with guide jigs and removing certain parts that may be unnecessary after assembly.

In addition, the design flexibility improved by this structure makes it possible to secure additional thermal dissipation area within the power module or create current paths that reduce parasitic inductance, thereby improving the performance of the power module.

Furthermore, the structure allowing for spacers to be pressed into the printed circuit board makes it possible to broaden the range of material choices for forming current paths and enhance heat dissipation performance.

Although the present disclosure has been illustrated and described in connection with specific implementations, it will be obvious to those skilled in the art that various modification and changes can be made thereto without departing from the scope of the present disclosure that is defined by the appended claims.

What is claimed is:

1. A power module comprising:

a first substrate, the first substrate comprising a plurality of layers that are stacked in a first axis direction;

a semiconductor chip electrically connected to the first substrate;

a printed circuit board connected to the semiconductor chip, the printed circuit board comprising at least one step portion that is recessed in the first axis direction and has a reduced thickness in the first axis direction less than a thickness of an area of the printed circuit board surrounding the at least one step portion; and at least one metal block disposed at the at least one step portion and electrically connected to the first substrate, wherein the printed circuit board is spaced apart from the first substrate in the first axis direction and faces the first substrate, and the semiconductor chip is disposed between the first substrate and the printed circuit board.

2. The power module of claim 1, wherein the at least one metal block has a planar shape facing the at least one step portion in the first axis direction, and wherein the at least one step portion has a shape corresponding to the planar shape of the at least one metal block.

3. The power module of claim 2, wherein the shape of the at least one step portion and the planar shape of the at least one metal block defines an engaging structure configured to restrict a positional change of the at least one metal block in a second axis direction crossing the first axis direction.

4. The power module of claim 3, wherein the at least one metal block has a first side and a second side that are spaced apart from each other in the second axis direction, the first side being wider than the second side in the second axis direction, and wherein the at least one step portion has:

a first region that is disposed at a central part of the printed circuit board and corresponds to an end of the first side of the at least one metal block, and a second region that is disposed at an outer part of the printed circuit board and corresponds to an end of the second side of the at least one metal block.

5. The power module of claim 1, wherein the at least one step portion is defined at one side of the printed circuit board facing the first substrate, and wherein the at least one metal block is positioned between the first substrate and the printed circuit board.

6. The power module of claim 5, wherein the first substrate comprises at least one substrate step portion that is recessed away from the printed circuit board in the first axis direction, the at least one substrate step portion having a reduced thickness in the first axis direction that is less than a thickness of an area of the first substrate surrounding the at least one substrate step portion.

7. The power module of claim 6, wherein the at least one metal block has a first side and a second side that are spaced apart from each other in the first axis direction, wherein the step portion of the printed circuit board has a shape corresponding to a shape of the first side of the at least one metal block, and wherein the step portion of the first substrate has a shape corresponding to a shape of the second side of the at least one metal block.

8. The power module of claim 1, wherein the at least one metal block comprises a plurality of metal blocks that are spaced apart from each other in a second axis direction crossing the first axis direction, and wherein the semiconductor chip is disposed between the plurality of metal blocks in the second axis direction.

9. The power module of claim 1, further comprising:

a second substrate spaced apart from the first substrate in the first axis direction, the second substrate comprising a plurality of layers stacked in the first axis direction, wherein the semiconductor chip is disposed between the first substrate and the second substrate, and wherein the at least one metal block is connected to at least one of the first substrate or the second substrate.

10. The power module of claim 9, wherein the printed circuit board has a first side and a second side opposite to the first side in the first axis direction, wherein at least one step portion of the printed circuit board comprises (i) a first step portion defined at the first side of the printed circuit board and (ii) a second step portion defined at the second side of the printed circuit board.

11. The power module of claim 10, wherein the first step portion and the second step portion at least partially overlap with each other along the first axis direction.

12. The power module of claim 9, further comprising:

a spacer that extends in the first axis direction and is disposed inside the printed circuit board, wherein the printed circuit board defines a through hole that receives the spacer between the first substrate and the second substrate, the spacer being connected to the semiconductor chip.

13. The power module of claim 12, wherein an area of the through hole corresponds to a cross-sectional area of the spacer in the first axis direction.

14. The power module of claim 1, wherein the first substrate, the semiconductor chip, and at least one metal block are stacked in the first axis direction and coupled to one another.

15. The power module of claim 1, wherein the at least one metal block protrudes from the printed circuit board in a second axis direction crossing the first axis direction and is configured to connect to an external terminal.

16. A power module comprising:

a first substrate, the first substrate comprising a plurality of layers that are stacked in a first axis direction;

a semiconductor chip electrically connected to the first substrate;

a printed circuit board connected to the semiconductor chip, the printed circuit board comprising at least one step portion that is recessed in the first axis direction and has a reduced thickness in the first axis direction less than a thickness of an area of the printed circuit board surrounding the at least one step portion; and at least one metal block disposed at the at least one step portion and electrically connected to the first substrate, wherein the at least one step portion is defined at one side of the printed circuit board facing the first substrate, wherein the at least one metal block is positioned between the first substrate and the printed circuit board, and wherein the first substrate comprises at least one substrate step portion that is recessed away from the printed circuit board in the first axis direction, the at least one substrate step portion having a reduced thickness in the first axis direction that is less than a thickness of an area of the first substrate surrounding the at least one substrate step portion.

17. A power module comprising:

a first substrate, the first substrate comprising a plurality of layers that are stacked in a first axis direction;

a semiconductor chip electrically connected to the first substrate;

a printed circuit board connected to the semiconductor chip, the printed circuit board comprising at least one step portion that is recessed in the first axis direction and has a reduced thickness in the first axis direction less than a thickness of an area of the printed circuit board surrounding the at least one step portion;

at least one metal block disposed at the at least one step portion and electrically connected to the first substrate; and a second substrate spaced apart from the first substrate in the first axis direction, the second substrate comprising a plurality of layers stacked in the first axis direction, wherein the semiconductor chip is disposed between the first substrate and the second substrate, and wherein the at least one metal block is connected to at least one of the first substrate or the second substrate.

* * * * *